US012638498B2

(12) United States Patent
Lee et al.

(10) Patent No.: US 12,638,498 B2
(45) Date of Patent: May 26, 2026

(54) SEMICONDUCTOR WAFER TEST SYSTEM BY FEEDBACK CONTROL

(71) Applicant: SAMSUNG ELECTRONICS CO., LTD., Suwon-si (KR)

(72) Inventors: Gibong Lee, Suwon-si (KR); Sungok Yu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 295 days.

(21) Appl. No.: 18/232,056

(22) Filed: Aug. 9, 2023

(65) Prior Publication Data

US 2024/0053399 A1    Feb. 15, 2024

(30) Foreign Application Priority Data

Aug. 10, 2022    (KR) ........................ 10-2022-0100006

(51) Int. Cl.
*G01R 31/28* (2006.01)
(52) U.S. Cl.
CPC ..... *G01R 31/2877* (2013.01); *G01R 31/2831* (2013.01)
(58) Field of Classification Search
CPC ............... G01R 31/28; G01R 31/2831; G01R 31/2868; G01R 31/2874; G01R 31/2877; G01R 31/2875; H01L 21/67103; H01L 21/67109
See application file for complete search history.

(56) References Cited

U.S. PATENT DOCUMENTS

| | | | |
|---|---|---|---|
| 8,747,559 B2 | 6/2014 | Steger | |
| 8,950,469 B2 | 2/2015 | Sasaki et al. | |
| 9,520,315 B2 | 12/2016 | Parkhe et al. | |
| 10,515,786 B2 | 12/2019 | Koiwa et al. | |
| 2006/0266060 A1 | 11/2006 | Choi et al. | |

(Continued)

FOREIGN PATENT DOCUMENTS

| | | |
|---|---|---|
| JP | 2007-48854 A | 2/2007 |
| JP | 4593007 B2 | 12/2010 |

(Continued)

OTHER PUBLICATIONS

Espacenet English translation KR 20190078791 A (Year: 2019).*

(Continued)

*Primary Examiner* — Eman A Alkafawi
*Assistant Examiner* — Courtney G McDonnough
(74) *Attorney, Agent, or Firm* — Sughrue Mion, PLLC

(57) ABSTRACT

A wafer test system includes: a first heat source unit including a first refrigerant having a first temperature range; a second heat source unit including a second refrigerant having a second temperature range; a wafer chuck to support a wafer, which: a heating member to heat the wafer, and a channel to circulate the first refrigerant and the second refrigerant; a first supply line connected to the first heat source unit, the first supply line to circulate and supply the first refrigerant to the channel; a second supply line connected to the second heat source unit, the second supply line to circulate and supply the second refrigerant to the channel; and a controller to selectively control supply of the first refrigerant and the second refrigerant based on a target temperature for testing the wafer on the wafer chuck.

18 Claims, 7 Drawing Sheets

(56)                    References Cited

U.S. PATENT DOCUMENTS

| | | | |
|---|---|---|---|
| 2009/0102499 A1 | 4/2009 | Segawa et al. | |
| 2010/0224352 A1 | 9/2010 | Stuckey et al. | |
| 2011/0066294 A1* | 3/2011 | Takechi | H01L 21/67109 |
| | | | 700/282 |
| 2011/0154843 A1 | 6/2011 | Ko et al. | |
| 2014/0072015 A1 | 3/2014 | Han et al. | |
| 2019/0244840 A1 | 8/2019 | Lim et al. | |
| 2022/0310368 A1* | 9/2022 | Kuwada | G05D 23/1919 |

FOREIGN PATENT DOCUMENTS

| | | | | | |
|---|---|---|---|---|---|
| JP | 5897275 B2 | 3/2016 | | | |
| KR | 10-2002-0045725 A | 6/2002 | | | |
| KR | 10-2002-0070668 A | 9/2002 | | | |
| KR | 10-0609845 B1 | 8/2006 | | | |
| KR | 10-0647998 B1 | 11/2006 | | | |
| KR | 10-2006-0124012 A | 12/2006 | | | |
| KR | 10-0653455 B1 | 12/2006 | | | |
| KR | 10-0707976 B1 | 4/2007 | | | |
| KR | 10-0718825 B1 | 5/2007 | | | |
| KR | 10-0875838 B1 | 12/2008 | | | |
| KR | 10-0890961 B1 | 3/2009 | | | |
| KR | 10-2009-0095456 A | 9/2009 | | | |
| KR | 10-2010-0075124 A | 7/2010 | | | |
| KR | 10-2011-0048547 A | 5/2011 | | | |
| KR | 10-2011-0078598 A | 7/2011 | | | |
| KR | 10-2011-0125441 A | 11/2011 | | | |
| KR | 10-1227153 B1 | 1/2013 | | | |
| KR | 10-1237936 B1 | 2/2013 | | | |
| KR | 10-1249469 B1 | 4/2013 | | | |
| KR | 10-2014-0052611 A | 5/2014 | | | |
| KR | 10-2014-0065166 A | 5/2014 | | | |
| KR | 10-2015-0007554 A | 1/2015 | | | |
| KR | 10-2015-0007555 A | 1/2015 | | | |
| KR | 10-1564172 B1 | 10/2015 | | | |
| KR | 10-1576063 B1 | 12/2015 | | | |
| KR | 10-1705667 B1 | 2/2017 | | | |
| KR | 10-1739369 B1 | 5/2017 | | | |
| KR | 10-1757439 B1 | 7/2017 | | | |
| KR | 10-2017-0112781 A | 10/2017 | | | |
| KR | 10-2017-0139240 A | 12/2017 | | | |
| KR | 10-1936425 B1 | 1/2019 | | | |
| KR | 10-1940287 B1 | 1/2019 | | | |
| KR | 10-2019-0078791 A | 7/2019 | | | |
| KR | 20190078791 A | * | 7/2019 | ....... | H01L 21/67098 |
| KR | 10-2024316 B1 | 9/2019 | | | |
| KR | 10-2020-0129985 A | 11/2020 | | | |
| KR | 10-2020-0129999 A | 11/2020 | | | |
| KR | 10-2260187 B1 | 6/2021 | | | |
| KR | 10-2021-0090355 A | 7/2021 | | | |
| KR | 10-2021-0106723 A | 8/2021 | | | |
| KR | 10-2290890 B1 | 8/2021 | | | |
| KR | 10-2307839 B1 | 10/2021 | | | |
| KR | 10-2339630 B1 | 12/2021 | | | |
| WO | WO-2007017981 A1 | * | 2/2007 | ....... | H01L 21/67248 |

OTHER PUBLICATIONS

English translation WO2007017981A1 (Year: 2007).*
Communication dated May 17, 2023, issued by the Korean Patent Office in Korean Application No. 10-2022-0100006.

* cited by examiner

SEMICONDUCTOR WAFER TEST SYSTEM BY FEEDBACK CONTROL

CROSS-REFERENCE TO RELATED APPLICATION(S)

This application claims benefit of priority under 35 U.S.C. § 119 to Korean Patent Application No. 10-2022-0100006 filed on Aug. 10, 2022 in the Korean Intellectual Property Office, the disclosure of which is incorporated herein by reference in its entirety.

BACKGROUND

1. Field

The disclosure relates to a semiconductor wafer test system by feedback control.

2. Description of Related Art

After a semiconductor wafer is processed in a semiconductor manufacturing process, an inspection process to inspect whether the wafer is operating normally is required.

In general, semiconductor wafers are typically used to manufacture semiconductor devices or semiconductor chips through a series of semiconductor processes, such as lithography, chemical or physical deposition, and plasma etching. Quality of the semiconductor devices, such as semiconductor chips, manufactured in this manner may vary depending on variables, such as quality of wafers or the way in which the wafers are processed. One of important variables in the manufacturing of semiconductor devices may be a temperature of a wafer surface. For example, when a wafer is processed, a temperature of the wafer surface may not be uniform, and thus, an etching rate of the wafer surface may vary. High quality semiconductors may be manufactured when the temperature of the wafer surface is controlled to be uniform.

SUMMARY

Provided is a semiconductor wafer test system having improved reliability.

According to an aspect of the disclosure, a semiconductor wafer test system includes: a first heat source unit including a first refrigerant having a first temperature range; a second heat source unit including a second refrigerant having a second temperature range that is higher than the first temperature range; a wafer chuck configured to support a wafer, the wafer chuck including: a heating member configured to heat the wafer, and a channel configured to circulate the first refrigerant and the second refrigerant; a first supply line connected to the first heat source unit, the first supply line being configured to circulate and supply the first refrigerant to the channel of the wafer chuck; a second supply line connected to the second heat source unit, the second supply line being configured to circulate and supply the second refrigerant to the channel of the wafer chuck; and a controller configured to selectively control supply of the first refrigerant and the second refrigerant based on a target temperature for testing the wafer on the wafer chuck.

According to another aspect of the disclosure, a semiconductor wafer test system includes: a first heat source unit including a first refrigerant having a first temperature range; a second heat source unit including a second refrigerant having a second temperature range that is higher than the first temperature range; a wafer chuck configured to support a wafer, the wafer including: a heating member configured to heat the wafer, and a channel configured to circulate the first refrigerant and the second refrigerant; a first supply line connected to the first heat source unit, the first supply line being configured to circulate and supply the first refrigerant to the channel of the wafer chuck; a second supply line connected to the second heat source unit, the second supply line being configured to circulate and supply the second refrigerant to the channel of the wafer chuck; a pump connected to the first supply line and the second supply line, the pump being configured to apply a supply pressure to the first and second refrigerants; a first valve configured to open or close the first supply line and a second valve configured to open or close the second supply line; and a controller configured to: select, as a supply refrigerant, one of the first refrigerant and the second refrigerant based on a target temperature for testing the wafer on the wafer chuck, adjust the selected supply refrigerant to a desired temperature by controlling the first heat source unit or the second heat source unit, and control a supply amount of the selected refrigerant by opening or closing the first valve or the second valve.

According to another aspect of the disclosure, a semiconductor wafer test system includes: a first heat source unit including a first refrigerant having a first temperature range; a second heat source unit including a second refrigerant having a second temperature range that is higher than the first temperature range; a wafer chuck configured to support a wafer, the wafer chuck including: a heating member configured to heat the wafer, a first channel configured to circulate the first refrigerant, and a second channel configured to circulate the second refrigerant; a first supply line connected to the first heat source unit and the first channel, the first supply line being configured to circulate and supply the first refrigerant to the wafer chuck; a second supply line connected to the second heat source unit and the second channel, the second supply line being configured to circulate and supply the second refrigerant to the wafer chuck; and a controller configured to selectively control supply of the first refrigerant and the second refrigerant based on a target temperature for testing the wafer on the wafer chuck.

BRIEF DESCRIPTION OF DRAWINGS

The above and other aspects, features, and advantages of the disclosure will be more clearly understood from the following detailed description, taken in conjunction with the accompanying drawings, in which.

DETAILED DESCRIPTION

Hereinafter, a semiconductor wafer test system according to various embodiments of the disclosure will be described in detail with reference to the accompanying drawings.

Figure 1:
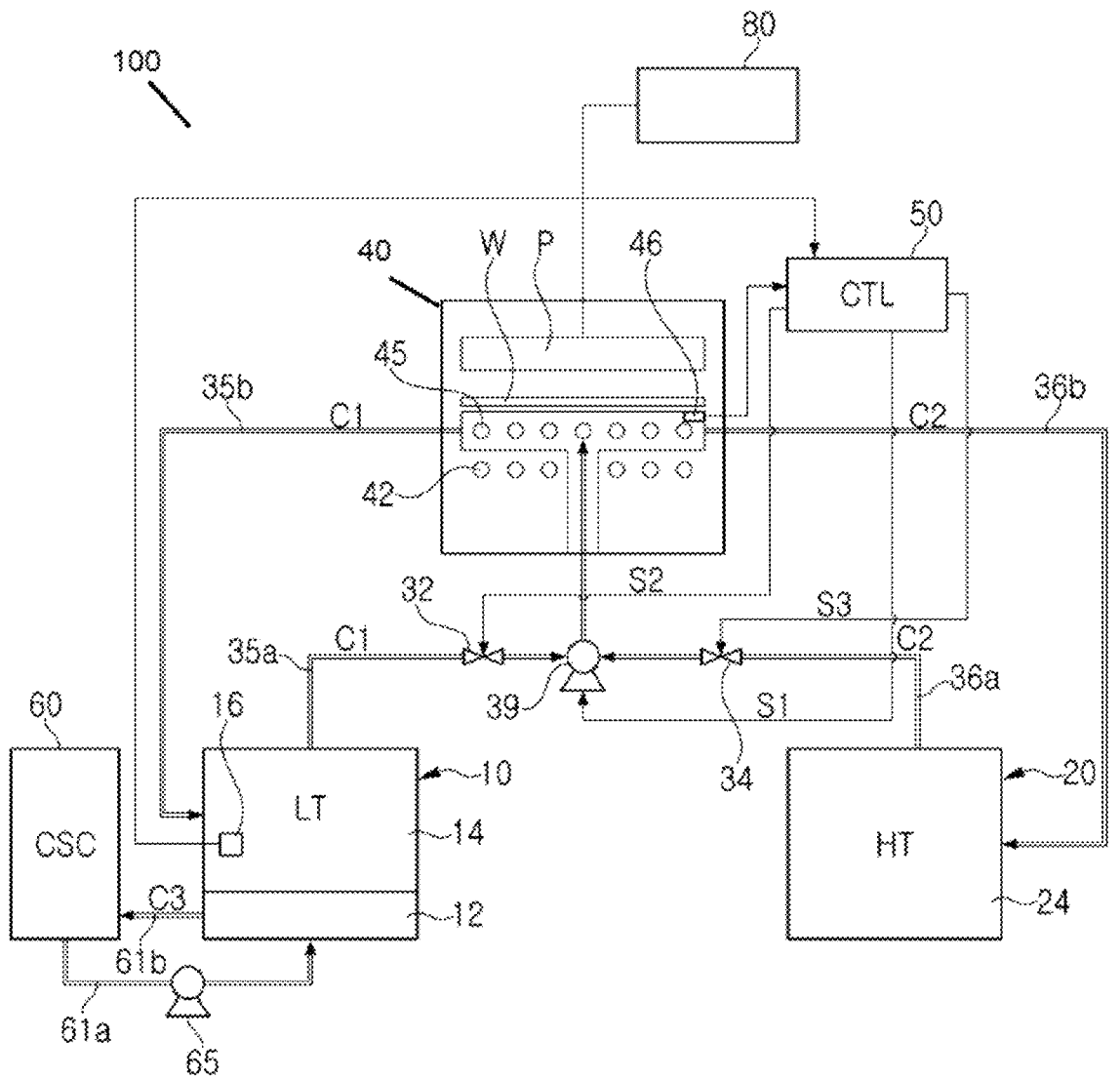
FIG. 1 is a schematic diagram of a semiconductor wafer test system according to an embodiment of the disclosure.
Figure 2:
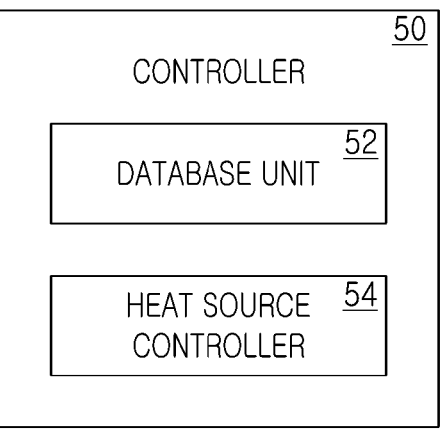
FIG. 2 is a block diagram illustrating a controller employable in a semiconductor wafer test system according to an embodiment of the disclosure.

FIG. 1 is a schematic diagram of a semiconductor wafer test system according to an embodiment of the disclosure, and FIG. 2 is a functional block diagram illustrating a controller employable in the semiconductor wafer test system according to an embodiment of the disclosure.

Referring to FIGS. 1 and 2, a semiconductor wafer test system 100 according to the present embodiment includes a first heat source unit 10 in which a first refrigerant C1 having a first temperature range is stored, a second heat source unit 20 in which a second refrigerant C2 having a second temperature range is stored, a wafer chuck 40 supporting a wafer W and including a heating member 42 for heating the wafer W, first supply lines 35a and 35b connected to the first heat source unit 10 and circulating and supplying the first refrigerant C1 to the wafer chuck 40, second supply lines 36a and 36b connected to the second heat source unit 20 and circulating and supplying the second refrigerant C2 to the wafer chuck 40, and a controller 50 selectively controlling the supply of the first refrigerant C1 and the second refrigerant C2 according to a target temperature for testing the wafer W supported on the wafer chuck 40.

After forming semiconductor devices through a series of processes, a test process for testing electrical characteristics of the semiconductor devices may be performed. The test process may be performed by a probe station 80 including a probe card P having a plurality of probes. The probe card P may be disposed on the wafer chuck 40 supporting the wafer to provide electrical signals to the semiconductor devices formed on the wafer W.

Such a test may be performed at different temperatures depending on the type thereof. In this specification, the temperature is also referred to as a "target temperature" for testing. The target temperature may be a certain temperature in the range of $-40°$ C. to $150°$ C. For example, the target temperature may be $-25°$ C. or $100°$ C. depending on the type of test.

The semiconductor wafer test system 100 according to the present embodiment may change temperature of the wafer W or the wafer chuck 40 to the target temperature for a test using the first heat source unit 10 in which the first refrigerant C1 is stored and the second heat source unit 20 in which the second refrigerant C2 is stored. The temperature of the wafer W or the wafer chuck 40 may be changed to a target temperature for testing. The second temperature range of the second refrigerant C2 may be higher than the first temperature range. In some embodiments, the second refrigerant C2 may have a temperature above room temperature. For example, the first temperature range of the first refrigerant C1 may be about $-80$ to $-60°$ C., and the second temperature range of the second refrigerant C2 may be about 20 to $90°$ C. As a specific example, when cooling a high-temperature (e.g., $300°$ C.) wafer to a target temperature of $100°$ C. for testing after a process is completed, the occurrence of non-uniform temperature distribution due to a rapid temperature difference may be reduced using the second refrigerant of the second heat source unit, rather than the first refrigerant of the first heat source unit.

As shown in FIG. 1, in the present embodiment, the wafer chuck 40 may include a heating member 42 and a channel 45 provided therein as flow paths for the first and second refrigerants C1 and C2. The first refrigerant C1 or the second refrigerant C2 may be supplied through the channel 45 to change the temperature of the wafer W seated on the wafer chuck 40. In the present embodiment, the heating member 42 may also be installed inside the wafer chuck W. The first refrigerant and the second refrigerant employed in the present embodiment may include the same refrigerant material (e.g., Novec7500 of 3M). By using the same refrigerant material, the same refrigerant material may be supplied through one supply path (e.g., the channel 45).

The first supply lines (a first line 35a and a second line 35b) may circulate and supply the first refrigerant C1 to the channel 45 of the wafer chuck 40. In one embodiment, the first line 35a of the first supply lines supplies the first refrigerant C1 from the first heat source unit 10 to the wafer chuck 40 and the second line 35b of the first supply lines supplies the first refrigerant C1 from the wafer chuck 40 to the first heat source unit 10.

Similarly, the second supply lines (a third line 36a and a fourth line 36b) may circulate and supply the second refrigerant C2 to the channel 45 of the wafer chuck 40. In one embodiment, the third line 36a supplies the second refrigerant C2 from the second heat source unit 20 to the wafer chuck 40 and the fourth line 36b supplies the second refrigerant C2 from the wafer chuck 40 to the second heat source unit 20.

The semiconductor wafer test system 100 according to the present embodiment may further include a pump 39 installed in first supply lines 35a and 35b and second supply lines 36a and 36b, a first valve 32 for opening and closing the first supply lines 35a and 35b, and a second valve 34 for opening and closing the second supply lines 36a and 36b.

In the present embodiment, the pump 39 may be installed in the first line 35a and the third line 36a to apply a predetermined supply pressure to the first and second refrigerants C1 and C2. In some embodiments, the pump 39 may be configured as individual pumps for the first supply line and the second supply line.

When the wafer W is tested by a probe card P, the controller 50 employed in the present embodiment selectively controls supply of the first refrigerant C1 and the second refrigerant C2 so that a temperature of the wafer W seated on the wafer chuck 40 may be changed.

For example, the first pump 30 may apply a supply pressure to the first refrigerant C1 and the second refrigerant C2 according to a pump control signal 51 from the controller 50, and in the applied state, the controller 50 may selectively open and close the first valve 32 and the second valve 34 by transmitting valve control signals S2 and S3. Through this control, one of the first refrigerant C1 and the second refrigerant C2 may be selected and supplied to the wafer chuck 40.

The controller 50 may include: a database unit 52 storing information on at least one of the first refrigerant C1 and the second refrigerant C2, which is a supply refrigerant, and a temperature and a supply amount of the supply refrigerant according to the target temperature and the temperature of the wafer; and a heat source controller 54 controlling a supply amount of the second refrigerant C2 with respect to the first refrigerant C1. In some embodiments (refer to FIG. 3), the heat source controller 54 may control each of the first heat source unit 10 and the second heat source unit 20 to adjust a temperature of the first refrigerant C1 or the second refrigerant C2 based on the information.

In some embodiments, the semiconductor wafer test system 100 according to the present embodiment further includes a multistage expansion system 60 supplying a third refrigerant C3 to the first heat source unit 10. The third refrigerant C3 may be cooled to a desired cryogenic temperature by multistage expansion.

The first heat source unit 10 may include a heat exchanger 12 controlling the temperature of the first refrigerant C1 by using heat exchange with the third refrigerant C3 supplied from the multistage expansion system 60, supply lines 61a and 61b for circulating and supplying the third refrigerant C3 between the multistage expansion system 60 and the heat exchanger 12, a valve for opening and closing the supply lines 61a and 61b, a first accommodating portion 14 for accommodating the first refrigerant C1 supplied from the heat exchanger 12, and a first temperature sensor 16 measuring temperature of the first refrigerant C1 in the first accommodating portion 14.

In this structure, the first refrigerant C1 may be maintained in a first temperature range corresponding to sub-zero, for example, at a low temperature of about −80 to −60° C.

The second heat source unit 20 may include a second accommodating portion 24 accommodating the second refrigerant C2. Here, the second refrigerant C2 may also be maintained in the first temperature range equal to or higher than room temperature. In some embodiments, the second heat source unit may further include a heating unit and a second temperature sensor to control the temperature of the second refrigerant in a relatively wide temperature range of room temperature or higher, for example, in a range of about 20 to 90° C. (refer to FIG. 3 reference).

In the related art, when changing the temperature of the wafer chuck 40 from a low temperature to a high temperature for a test, the wafer chuck 40 in a cryogenic state is dependent on local heating by the heating member 42 included therein, and thus, a thermal expansion rate of the surface of the wafer chuck 40 may vary, and as a result, contact failure may occur between the wafer chuck 40 and the wafer W, resulting in test failure.

In contrast, according to the present embodiment, when the temperature of the wafer chuck 40 is changed from a low temperature to a high temperature, before or while the wafer chuck 40 in a cryogenic state by the first heating source unit 10 is locally heated by the heating member 42 thereof, the second refrigerant C2 of the second heating source unit 20 having a temperature equal to or higher than room temperature may be circulated through the channel 45 of the wafer chuck 40, thereby maintaining a relatively uniform thermal expansion over the entire region of the wafer W, and thus, improving the reliability of the wafer W test.

Figure 3:
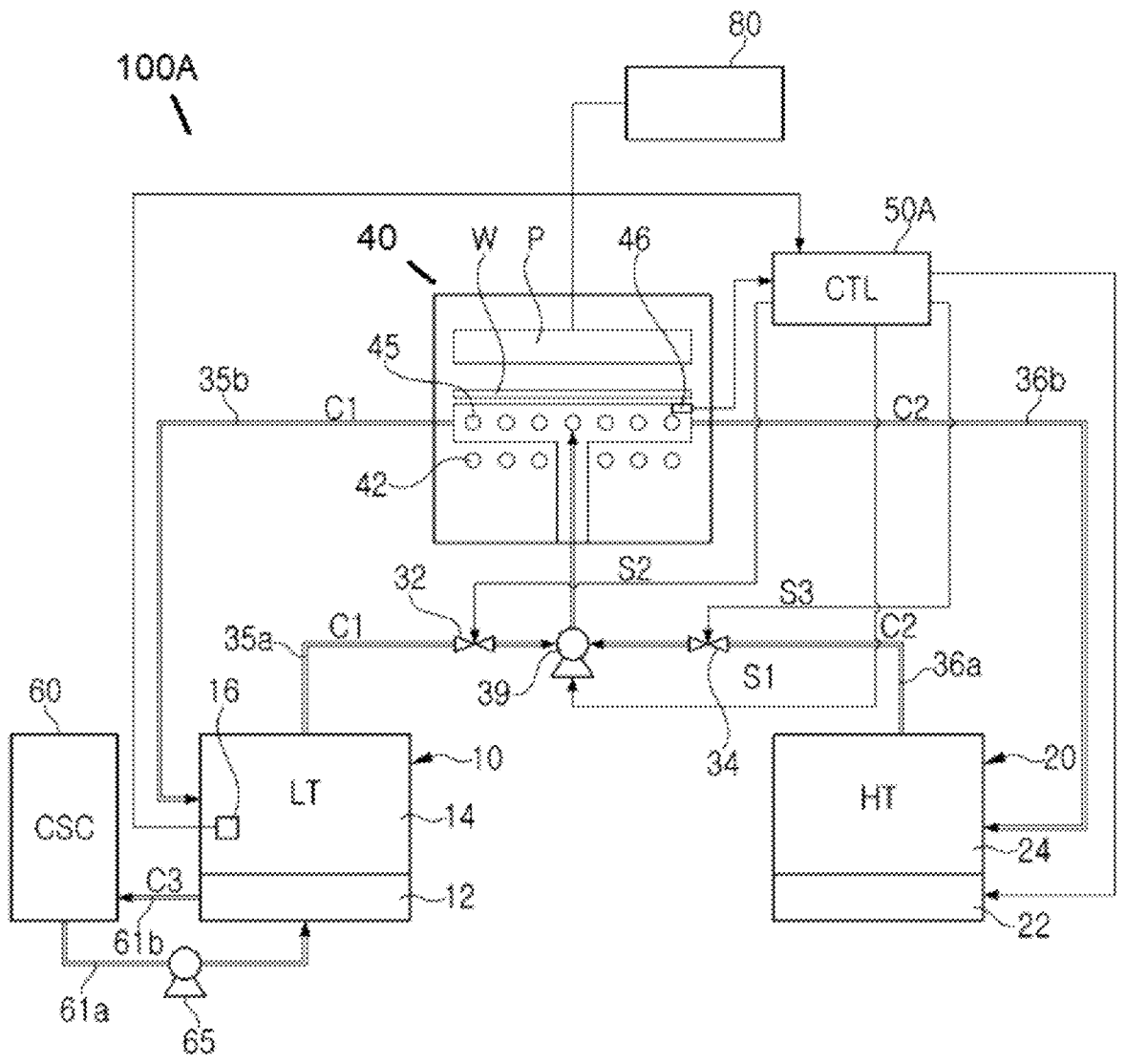
FIG. 3 is a schematic diagram of a semiconductor wafer test system according to an embodiment of the disclosure.
Figure 4:
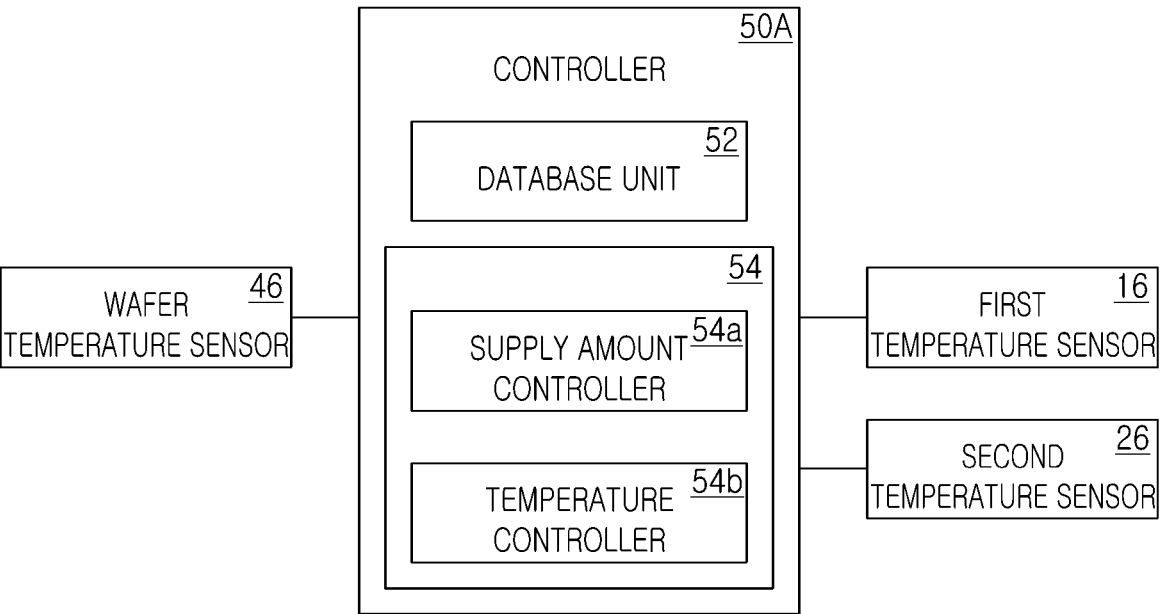
FIG. 4 is a block diagram illustrating a configuration of a controller employable in a semiconductor wafer test system according to an embodiment of the disclosure.

In the semiconductor wafer test system according to the disclosure, the temperature of the refrigerant (in particular, the second refrigerant) may be controlled upon receiving feedback of the temperature of the wafer chuck 40, thereby making a temperature distribution in the entire region of the wafer W more uniform and ensuring precise testing. FIGS. 3 and 4 illustrate the present embodiment.

FIG. 3 is a schematic diagram of a semiconductor wafer test system according to an embodiment of the disclosure, and FIG. 4 is a block diagram illustrating a configuration of a controller employable in a semiconductor wafer test system according to an embodiment of the disclosure.

Referring to FIGS. 3 and 4, a semiconductor wafer test system 100A according to the present embodiment may be understood as having a structure similar to the semiconductor wafer test system 100 shown in FIGS. 1 and 2, except that the second heat source unit 20 further includes a second temperature sensor 26 and a heating unit 22 and that a heat source controller 54 of a controller 50A controls the second heat source unit 20 to control the temperature of the second refrigerant C2. In addition, components of the present embodiment may be understood with reference to the descriptions of the same or similar components of the semiconductor wafer test system 100 shown in FIGS. 1 and 2 unless otherwise stated.

A temperature of the wafer chuck 40 may be measured through a wafer temperature measuring unit 44, and the controller 50A may select, as a supply refrigerant, one of the first and second refrigerants C1 and C2 according to a difference between a target temperature for a test and a temperature of the wafer chuck (or a temperature of the wafer).

In the present embodiment, when the second refrigerant C2 is selected as the supply refrigerant, the temperature of the second refrigerant may be changed such that a deviation from the temperature of the wafer chuck is reduced.

The second heat source unit 20 employed in the present embodiment includes a second temperature sensor 26 for measuring the temperature of the second refrigerant C2. The heat source controller 54 according to the present embodiment may include a supply amount controller 54a controlling a related heat source unit (e.g., the second valve 34 of the second heat source unit 20) to supply a supply refrigerant (e.g., the second refrigerant C2) by a supply amount to the wafer chuck 40 and a temperature controller 54b controlling a related heat source unit (e.g., the heating unit (the second accommodating portion 24 of the second heat source unit 20)) to adjust temperature of the supply refrigerant (e.g., the second refrigerant C2).

For example, when the temperature of the wafer chuck 40 is changed from a low temperature to a high temperature, a supply temperature of the second refrigerant, together with the supply amount of the second refrigerant C2, may be controlled so that the temperature of the wafer chuck 40 is changed within a certain deviation range. In this manner, the temperature of the supply refrigerant according to the temperature deviation may be previously stored in the database unit 52 together with the supply amount of the refrigerant.

As such, by using a feedback system including the heating unit 22 and the second temperature sensor 26, the temperature of the second refrigerant C2 may be appropriately controlled in the first temperature range equal to or higher than room temperature, for example, in the range of about 20 to 90° C., before the second refrigerant C2 is supplied to the wafer chuck 40. Through this feedback control, it is possible to change the temperature of the wafer W to the target temperature, while minimizing the deviation from the temperature of the wafer W, thereby ensuring a more uniform temperature distribution over the entire region of the wafer W. Similar to the feedback control of the temperature of the second refrigerant C2, the temperature of the first refrigerant C1 may be similarly feedback-controlled.

Feedback control of the second refrigerant is exemplified by the heating unit 22, but the second refrigerant may be controlled to a low temperature by cooling, as well as heating to the first temperature range, by adopting a structure similar to heat exchange.

Figure 5:
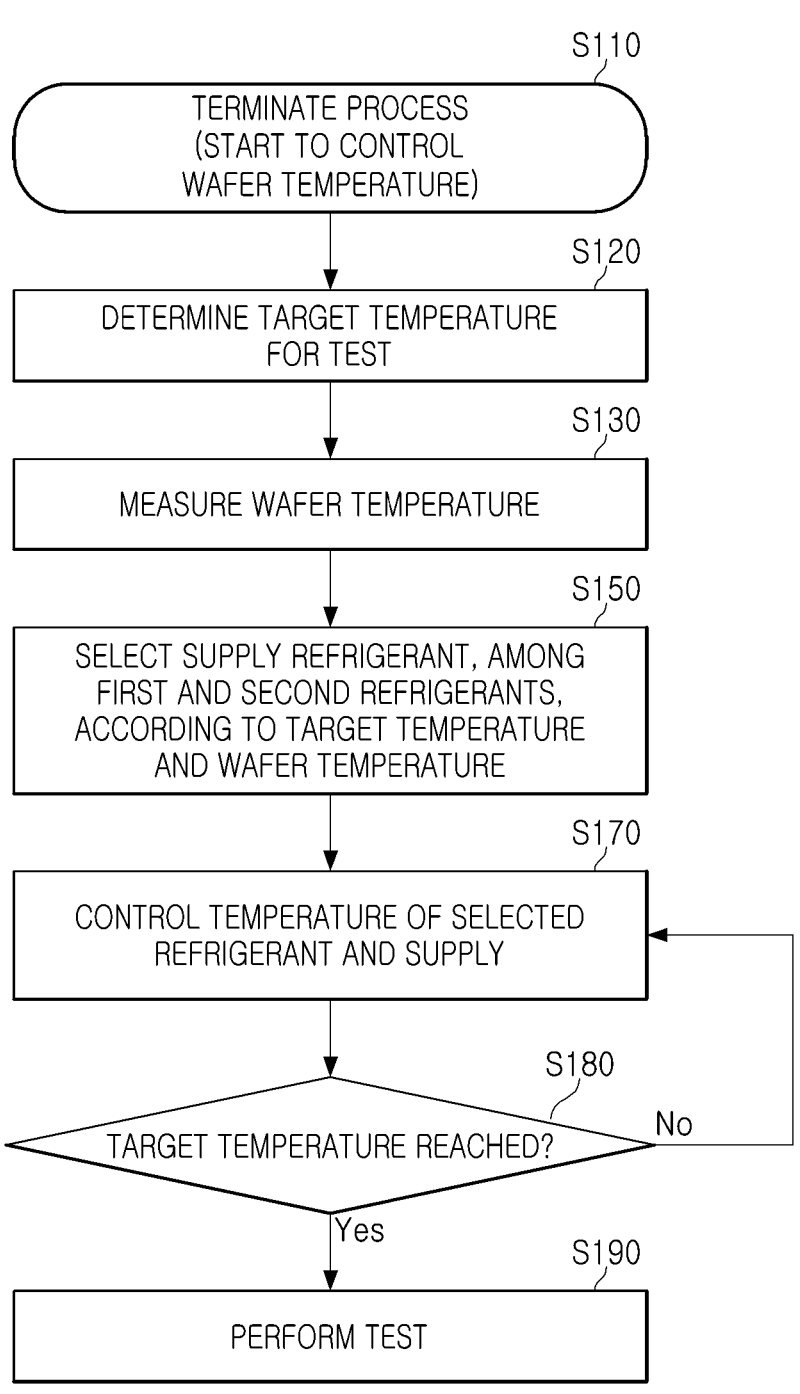
FIG. 5 is a flowchart illustrating an example of a wafer temperature adjustment process in a semiconductor wafer test system according to an embodiment of the disclosure.

FIG. 5 is a flowchart illustrating an example of a wafer temperature control process in a semiconductor wafer test system according to an embodiment of the disclosure. The temperature control process of FIG. 5 may be understood as a process performed in the semiconductor wafer test system 100A shown in FIGS. 3 and 4.

First, referring to FIG. 5 together with FIG. 3, a wafer temperature control process may be started after a preceding semiconductor device manufacturing process is terminated (S110).

A target temperature required for testing according to the semiconductor device is determined (S120). The target temperature may be any temperature in the range of –40° C. to 150° C. For example, depending on the type of test, the target temperature may be –25° C. or 100° C.

Subsequently, the temperature of the wafer W on which the proceeding process has been terminated is measured (S130). This temperature measurement may be performed through the wafer chuck 40 or the wafer temperature sensor 46 located in a chamber adjacent to the wafer W. In some embodiments, if the immediately preceding process is a cryogenic etching process (e.g., –150° C. or less), a process of raising the temperature of the wafer W to the target temperature may be required. If the immediately preceding process is annealing (about 300° C.), a process of lowering the temperature of the wafer W to the target temperature may be required.

Next, depending on the target temperature and the wafer temperature, a supply refrigerant may be selected from among the first and second refrigerants C1 and C2 (S150), and a supply temperature and supply amount may be determined (S170). This process may be performed by the controller 50. The refrigerant-related information may be previously stored in the database unit 52 according to the target temperature and wafer temperature.

Subsequently, the temperature of the selected supply refrigerant may be adjusted, and the refrigerant having the adjusted temperature may be supplied according to a predetermined supply amount (S170). For example, when the second refrigerant C2 is selected, the controller 50 may heat or cool the second refrigerant C2 in the second temperature range in order to reduce a temperature deviation of the wafer W by the controller 50, specifically, by the temperature controller 54*b*. Next, the second valve 34 may be opened by the controller 50, specifically, by the supply amount controller 54*a*, to supply the temperature-adjusted second refrigerant C2 to the wafer chuck 40 by a required supply amount.

In operation S180, the supply refrigerant (e.g., the second refrigerant C2) may be supplied until the wafer W reaches the target temperature (S170), and when the wafer W reaches the target temperature, a follow-up test process may be performed (S190).

Figure 6:
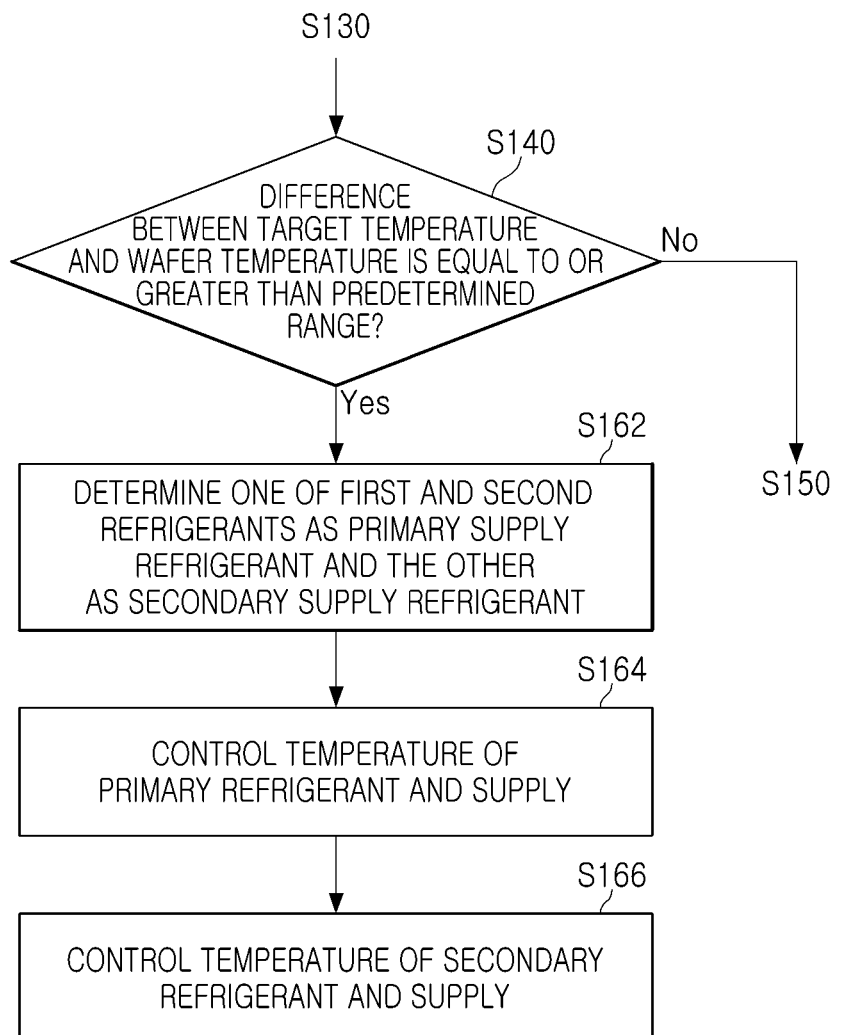
FIG. 6 is a flowchart illustrating another example of a wafer temperature adjustment process in a semiconductor wafer test system according to an embodiment of the disclosure.

In the previous embodiment, a method of selecting and supplying one of the first refrigerant and the second refrigerant according to the wafer temperature and the target temperature has been described, but in some embodiments, in order to control the target temperature of the wafer W, the first refrigerant C1 and the second refrigerant C2 may be supplied together (e.g., sequentially) (refer to FIG. 6).

FIG. 6 is a flowchart illustrating another example of a wafer temperature control process in a semiconductor wafer test system according to an embodiment of the disclosure.

Referring to FIG. 6, after measuring the water temperature (S130 in FIG. 5), when a difference between the target temperature and the temperature of the wafer W is greater than a predetermined value (S140, YES), a refrigerant having a temperature close to the temperature of the wafer W, among the first and second refrigerants C1 and C2, may be determined as a primary supply refrigerant, and a refrigerant having a temperature close to the target temperature, among the first and second refrigerants C1 and C2, may be determined as a secondary supply refrigerant (S162). For example, when the process of raising the temperature of the wafer W to a relatively high target temperature (e.g., 100° C.) is required for testing, immediately after a cryogenic etching process (e.g., –150° C. or lower), the first refrigerant C1 may be first supplied as a primary supply refrigerant to heat the wafer chuck (or the wafer W) in to a first medium temperature (e.g., –30° C.) (S164), and then the second refrigerant C2 may be supplied as a secondary supply refrigerant to heat the wafer chuck (or the wafer W) to a second medium temperature (e.g., 20° C.) (S166), and thereafter, the wafer chuck (or the wafer W) may be finally heated to a desired test temperature using the heating member 42. Thus, the wafer chuck (or the wafer W) may be sequentially and stepwise heated to a desired test temperature. Here, the process of heating the wafer chuck (or the wafer W) from a low temperature to a high temperature, but may be similarly performed in the case of changing temperature reversely. For example, when cooling a high-temperature wafer to a low-temperature target temperature, cooling may be performed by supplying the second refrigerant C2 as the primary supply refrigerant and the first refrigerant C1 as the secondary supply refrigerant. In addition, each supply refrigerant may be heated or cooled to an appropriate temperature range by controlling the corresponding heat source unit before being supplied. If the temperature difference is not significant (S140, No), the temperature of the wafer may be changed through the temperature adjustment process (S150) using a single refrigerant described above.

Figure 7:
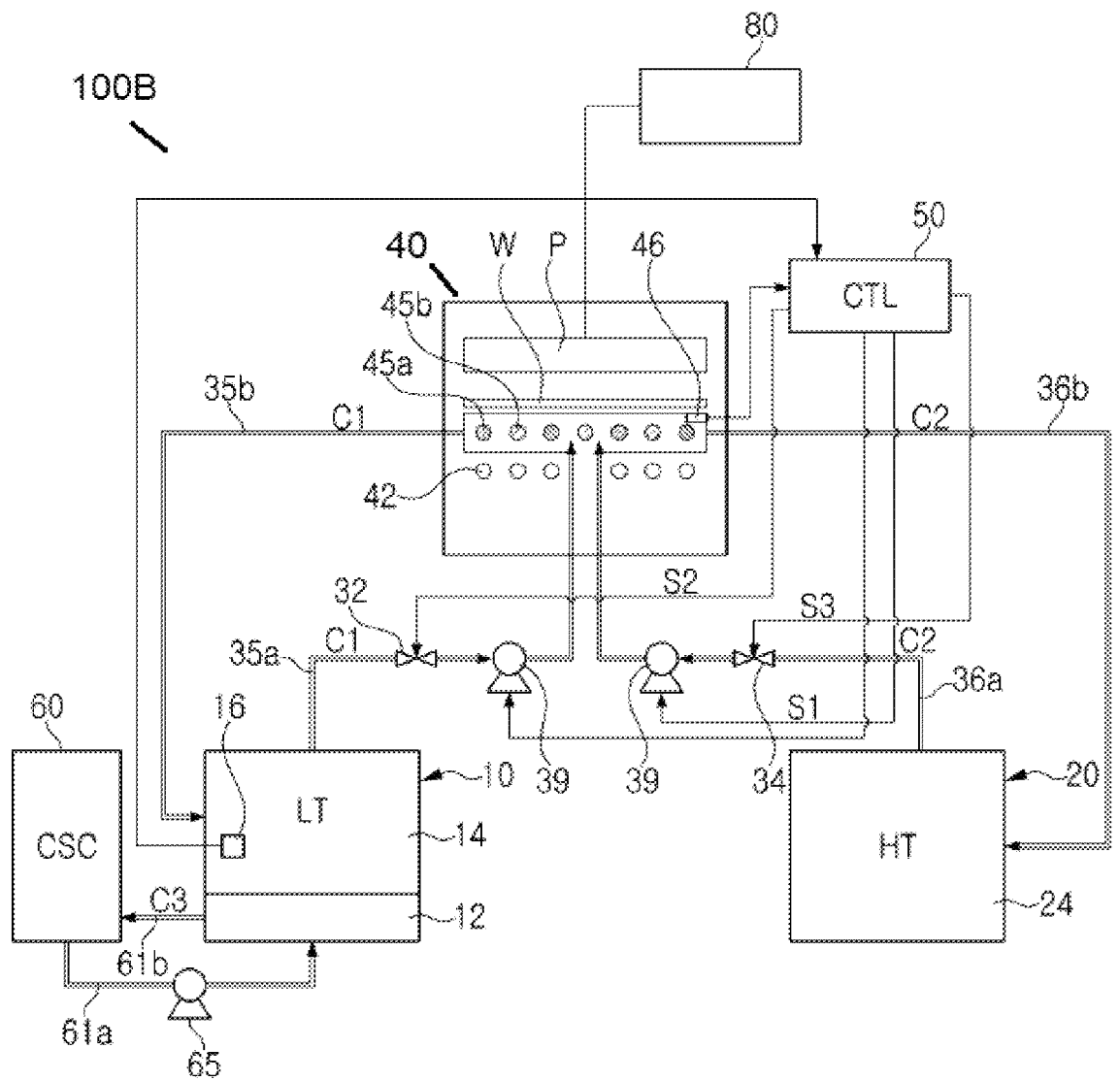
FIG. 7 is a schematic diagram of a semiconductor wafer test system by feedback control according to an embodiment of the disclosure.

FIG. 7 is a schematic diagram of a semiconductor wafer test system according to an embodiment of the disclosure.

Referring to FIG. 7, a semiconductor wafer test system 100B according to the present embodiment may be understood as having a structure similar to that of the semiconductor wafer test system 100 illustrated in FIGS. 1 and 2, except that the first and second refrigerants C1 and C2 include different refrigerant materials and that a circulation path for the first refrigerant C1 and a circulation path for the second refrigerant C2 are separated. In addition, components of the present embodiment may be understood with reference to descriptions of the same or similar components of the semiconductor wafer test system 100 shown in FIGS. 1 and 2 unless otherwise stated.

The first refrigerant C1 and the second refrigerant C2 may be different refrigerant materials. The first refrigerant C1 may have a first boiling point and a first freezing point, and the second refrigerant C2 may have a second boiling point higher than the first boiling point and a second freezing point higher than the first freezing point. Accordingly, first and second temperature ranges may be set to cover a wider range than that of the case in which the first and second refrigerants C1 and C2 use the same material. For example, the first refrigerant C1 may be a low-temperature-dedicated refrigerant (3M's Novec7200, Solvay's SV80W), and the second refrigerant C2 may be a high-temperature-dedicated refrigerant (e.g., 3M's FC3283, Solvay's HT135).

As such, since the first and second refrigerants C1 and C2 are different materials, the circulation paths of the two refrigerants C1 and C2 may be completely separated. Specifically, the wafer chuck 40 employed in the present embodiment may include a first channel 42*a* configured to circulate the first refrigerant C1 and a second channel 42*b* configured to circulate the second refrigerant C2. In addition, the first supply lines 35*a* and 35*b* may be connected to the first heat source unit 10 and the first channel 42*a* to circulate and supply the first refrigerant C1 to the wafer chuck 40, and the second supply lines 36*a* and 36*b* may be connected to the second heat source unit 20 and the second channel 42*b* to circulate and supply the second refrigerant C2 to the wafer chuck 40.

Pumps employed in the present embodiment may also be configured as separate pumps for the respective circulation structures. A first pump 39*a* may be mounted on the first supply line (in particular, 35*a*) and may be configured to apply a supply pressure to the first refrigerant C1, and a second pump 39*b* may be mounted on the second supply line (in particular, 36*a*) may be configured to apply a supply pressure to the second refrigerant C2.

According to the disclosure, it is possible to reduce a temperature distribution deviation of the wafer chuck caused by the large area of the wafer chuck. A rapid change in temperature may be avoided when the wafer temperature is changed to a test temperature by introducing an intermediate temperature heat source unit (e.g., the second heat source unit). As a result, reliability of the test may be further improved by implementing a relatively uniform temperature distribution over the entire region of the wafer. In addition, a test process may be performed more accurately by controlling an error in a measurement temperature occurring as latent heat of test electrical energy is accumulated in the wafer chuck due to a continuous and repetitive process of testing on the wafer.

While example embodiments have been shown and described above, it will be apparent to those skilled in the art that modifications and variations could be made without departing from the scope of the disclosure as defined by the appended claims.

What is claimed is:

1. A semiconductor wafer test system comprising:
   a first heat source unit comprising a first refrigerant having a first temperature range;
   a second heat source unit comprising a second refrigerant having a second temperature range that is higher than the first temperature range;
   a wafer chuck configured to support a wafer, the wafer chuck comprising:
      a heating member configured to heat the wafer, and
      a channel configured to circulate the first refrigerant and the second refrigerant;
   a first supply line connected to the first heat source unit, the first supply line being configured to circulate and supply the first refrigerant to the channel of the wafer chuck;
   a second supply line connected to the second heat source unit, the second supply line being configured to circulate and supply the second refrigerant to the channel of the wafer chuck; and
   a controller configured to selectively control supply of the first refrigerant and the second refrigerant based on a target temperature for testing the wafer on the wafer chuck,
   wherein the controller comprises a database unit comprising:
      information on at least one of the first refrigerant and the second refrigerant, which is a supply refrigerant, and
      a temperature and a supply amount of the supply refrigerant according to the target temperature and the temperature of the wafer, and
   wherein the temperature of the supply refrigerant according to a temperature deviation is previously stored in the database unit.

2. The semiconductor wafer test system of claim 1, wherein the first refrigerant and the second refrigerant are the same material.

3. The semiconductor wafer test system of claim 2, wherein the first temperature range is below zero in Celsius (° C.), and the second temperature range is equal to or higher than room temperature.

4. The semiconductor wafer test system of claim 1, further comprising:
   a pump connected to the first supply line and the second supply line, the pump being configured to apply a supply pressure to the first and second refrigerants;
   a first valve configured to open or close the first supply line; and
   a second valve configured to open or close the second supply line.

5. The semiconductor wafer test system of claim 4, wherein the controller is further configured to selectively control the supply of the first refrigerant and the second refrigerant by selectively controlling the first valve and the second valve.

6. The semiconductor wafer test system of claim 1, wherein the controller further comprises a heat source controller configured to control a heat source unit related to the supply refrigerant, among the first and second heat source units, in order to supply the supply refrigerant to the wafer chuck by the supply amount based on the information.

7. The semiconductor wafer test system of claim 6, wherein the heat source controller is further configured to control the heat source unit related to the supply refrigerant to adjust a temperature of the supply refrigerant based on the information.

8. The semiconductor wafer test system of claim 1, wherein the first heat source unit comprises:
   a heat exchanger configured to control the first refrigerant in the first temperature range by using heat exchange with a third refrigerant supplied from a multistage expansion system,
   a supply line configured to circulate and supply the third refrigerant between the multistage expansion system and the heat exchanger,
   a valve configured to open or close the supply line,
   a first accommodating portion configured to accommodate the first refrigerant supplied from the heat exchanger, and
   a first temperature sensor configured to measure a temperature of the first refrigerant in the first accommodating portion.

9. The semiconductor wafer test system of claim 1, wherein the second heat source unit comprises:
   a second accommodating portion configured to accommodate the second refrigerant,
   a heating unit configured to control the second refrigerant in the second temperature range, and
   a second temperature sensor configured to measure the temperature of the second refrigerant in the second accommodating portion.

10. The semiconductor wafer test system of claim 1, wherein, based on a difference between the target temperature and the temperature of the wafer, the difference being greater than a predetermined value, the controller is configured to determine a refrigerant having a temperature close to the temperature of the wafer, among the first and second refrigerants, as a primary supply refrigerant and the controller is also configured to determine a refrigerant having a temperature close to the target temperature, among the first and second refrigerants, as a secondary supply refrigerant.

11. A semiconductor wafer test system comprising:
a first heat source unit comprising a first refrigerant having a first temperature range;
a second heat source unit comprising a second refrigerant having a second temperature range that is higher than the first temperature range;
a wafer chuck configured to support a wafer, the wafer comprising:
a heating member configured to heat the wafer, and
a channel configured to circulate the first refrigerant and the second refrigerant;
a first supply line connected to the first heat source unit, the first supply line being configured to circulate and supply the first refrigerant to the channel of the wafer chuck;
a second supply line connected to the second heat source unit, the second supply line being configured to circulate and supply the second refrigerant to the channel of the wafer chuck;
a pump connected to the first supply line and the second supply line, the pump being configured to apply a supply pressure to the first and second refrigerants;
a first valve configured to open or close the first supply line and a second valve configured to open or close the second supply line; and
a controller configured to:
select, as a supply refrigerant, one of the first refrigerant and the second refrigerant based on a target temperature for testing the wafer on the wafer chuck,
adjust the selected supply refrigerant to a desired temperature by controlling the first heat source unit or the second heat source unit, and
control a supply amount of the selected refrigerant by opening or closing the first valve or the second valve,
wherein the controller comprises a database unit comprising:
information on at least one of the first refrigerant and the second refrigerant, which is the supply refrigerant, and
a temperature and the supply amount of the supply refrigerant according to the target temperature and the temperature of the wafer, and
wherein the temperature of the supply refrigerant according to a temperature deviation is previously stored in the database unit.
12. The semiconductor wafer test system of claim 11, wherein the first heat source unit comprises:
a heat exchanger configured to control the first refrigerant in the first temperature range by using heat exchange with a third refrigerant supplied from a multistage expansion system,
a supply line configured to calculate and supply the third refrigerant between the multistage expansion system and the heat exchanger,
a valve configured to open or close the supply line,
a first accommodating portion configured to accommodate the first refrigerant supplied from the heat exchanger, and
a first temperature sensor configured to measure a temperature of the first refrigerant in the first accommodating portion.
13. The semiconductor wafer test system of claim 11, wherein the second heat source unit comprises:
a second accommodating portion configured to accommodate the second refrigerant,
a heating unit configured to control the second refrigerant in the second temperature range, and a second temperature sensor configured to measure the temperature of the second refrigerant in the second accommodating portion.
14. A semiconductor wafer test system comprising:
a first heat source unit comprising a first refrigerant having a first temperature range;
a second heat source unit comprising a second refrigerant having a second temperature range that is higher than the first temperature range;
a wafer chuck configured to support a wafer, the wafer chuck comprising:
a heating member configured to heat the wafer,
a first channel configured to circulate the first refrigerant, and
a second channel configured to circulate the second refrigerant;
a first supply line connected to the first heat source unit and the first channel, the first supply line being configured to circulate and supply the first refrigerant to the wafer chuck;
a second supply line connected to the second heat source unit and the second channel, the second supply line being configured to circulate and supply the second refrigerant to the wafer chuck; and
a controller configured to selectively control supply of the first refrigerant and the second refrigerant based on a target temperature for testing the wafer on the wafer chuck,
wherein the controller comprises a database unit comprising:
information on at least one of the first refrigerant and the second refrigerant, which is a supply refrigerant, and
a temperature and a supply amount of the supply refrigerant according to the target temperature and the temperature of the wafer, and
wherein the temperature of the supply refrigerant according to a temperature deviation is previously stored in the database unit.
15. The semiconductor wafer test system of claim 14, wherein the first refrigerant comprises a first boiling point and a first freezing point, and the second refrigerant comprises a second boiling point higher than the first boiling point and a second freezing point higher than the first freezing point.
16. The semiconductor wafer test system of claim 14, further comprising:
a first pump connected to the first supply line, the first pump being configured to apply a first supply pressure to the first refrigerant,
a second pump connected to the second supply line, the second pump being configured to apply a second supply pressure to the second refrigerant,
a first valve configured to open or close the first supply line, and
a second valve configured to open or close the second supply line.
17. The semiconductor wafer test system of claim 16, wherein the controller is further configured to selectively control the supply of the first refrigerant and the second refrigerant by selectively controlling the first valve and the second valve.
18. The semiconductor wafer test system of claim 14, wherein the controller further comprises a heat source controller configured to control a heat source unit related to the supply refrigerant, among the first and second heat source units, in order to adjust a temperature of the supply refrigerant based on the information and supply the supply refrigerant to the wafer chuck by the supply amount based on the information.

\* \* \* \* \*